United States Patent
Emili et al.

(10) Patent No.: US 7,012,026 B2
(45) Date of Patent: Mar. 14, 2006

(54) METHOD FOR PRODUCING DEFINED POLYCRYSTALLINE SILICON AREAS IN AN AMORPHOUS SILICON LAYER

(75) Inventors: Walter Emili, Gomaringen (DE); Herbert Goebel, Reutlingen (DE); Harald Wanka, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 426 days.

(21) Appl. No.: 10/203,596

(22) PCT Filed: Jan. 26, 2001

(86) PCT No.: PCT/DE01/00314

§ 371 (c)(1),
(2), (4) Date: Dec. 2, 2002

(87) PCT Pub. No.: WO01/59818

PCT Pub. Date: Aug. 16, 2001

(65) Prior Publication Data

US 2004/0026358 A1    Feb. 12, 2004

(30) Foreign Application Priority Data

Feb. 9, 2000    (DE)    ............................ 100 05 564

(51) Int. Cl.
*H01L 21/302*    (2006.01)
(52) U.S. Cl. .................. 438/706; 438/714; 438/715; 438/719; 257/254; 257/417

(58) Field of Classification Search ................ 438/705, 438/706, 714, 715, 719; 257/254, 417
See application file for complete search history.

(56) References Cited

U.S. PATENT DOCUMENTS

| | | | |
|---|---|---|---|
| 4,622,856 A | | 11/1986 | Binder et al. |
| 5,518,951 A | * | 5/1996 | Paynter et al. ................ 438/50 |
| 6,140,668 A | * | 10/2000 | Mei et al. ...................... 257/66 |
| 6,713,330 B1 | * | 3/2004 | Zhang et al. ................ 438/166 |

OTHER PUBLICATIONS

Patent Abstracts of Japan vol. 005, No. 167 (E-079), Oct. 24, 1981 & JP 56 094622 A (Toshiba Corp), Jul. 31, 1981.
Patent Abstracts of Japan vol. 005, No. 023 (E-045), Feb. 12, 1981 & JP 55 150239 A (Mitsubishi Electric Corp), Nov. 22, 1980.

* cited by examiner

*Primary Examiner*—Nadine G. Norton
*Assistant Examiner*—Binh X. Tran
(74) *Attorney, Agent, or Firm*—Kenyon & Kenyon

(57) ABSTRACT

A method of producing well-defined polycrystalline silicon regions is described, in particular for producing electrically conducting regions, in which a substrate is provided with an insulating layer and a layer of doped amorphous silicon, electromagnetic irradiation is performed using a laser source to produce the electrically conducting regions, and a shadow mask is positioned between the laser source and the substrate having the layer for definition of the contours of the electrically conducting regions.

9 Claims, 2 Drawing Sheets

METHOD FOR PRODUCING DEFINED POLYCRYSTALLINE SILICON AREAS IN AN AMORPHOUS SILICON LAYER

FIELD OF THE INVENTION

The present invention relates to a method of producing well-defined polycrystalline silicon areas, in particular for producing electrically conducting regions.

BACKGROUND INFORMATION

Electrically conducting regions may be defined in an amorphous silicon layer by controlled production of polycrystalline silicon regions. Such polycrystalline silicon regions may be characterized by a good electric conductivity, which may optionally be adjusted by introducing suitable dopants. Furthermore, polycrystalline silicon has a high piezoresistivity, so it may be suitable for use of wire strain gauges. Such wire strain gauges may be used in pressure sensors, for example. An electric resistance, which may be determined via a corresponding analyzer circuit, changes due to the acting pressure.

Polycrystalline silicon may be produced by a LPCVD method (low-pressure chemical vapor deposition), where the deposition rate may be determined by the process temperature. The process temperatures may vary in ranges between 400° C. and 900° C., depending on the layer of polycrystalline silicon to be deposited.

If such polycrystalline silicon layers are deposited on heat-sensitive substrates, e.g., stainless steel substrates, to produce high-pressure sensors, the high thermal stress associated with such deposition may constitute a high process risk. To define geometrically the electrically conducting regions, they may be well-defined by photolithographic process steps. This may require that a masking layer be applied to the polysilicon layer and exposed, then the exposed or unexposed regions be removed selectively and next the polysilicon layer may be plasma etched, for example. Such methods may be relatively complicated to control and may allow only a limited structural fidelity.

SUMMARY OF THE INVENTION

An exemplary method according to the present invention may reduce a thermal load in production of polycrystalline silicon regions. Furthermore, an exact structural definition may be achieved so that process reliability and yield may be increased. In situ high resolution structuring of the polycrystalline silicon regions in the submicrometer range may be possible because a substrate may be provided with a layer of a doped amorphous silicon, the amorphous silicon may be irradiated using a laser source to produce the electrically conducting regions, a shadow mask being positioned between the substrate and the laser source to provide definition of the electrically conducting regions. Irradiation of the doped amorphous silicon using a laser source, in particular an excimer laser, may permit a controlled breakup of the bond structure of the amorphous silicon through direct electronic energization and production of a polycrystalline lattice structure as a function of the wavelength used and the duration of the laser treatment. Polycrystalline silicon having a high electric conductivity, a low temperature dependence of the resistance, and a marked piezoresistivity may be obtained by previously doping the amorphous silicon. Use of the shadow masks in laser treatment may also eliminate a requirement for photolithographic process steps. This may reduce manufacturing costs on the whole.

DETAILED DESCRIPTION

Figure 1A:
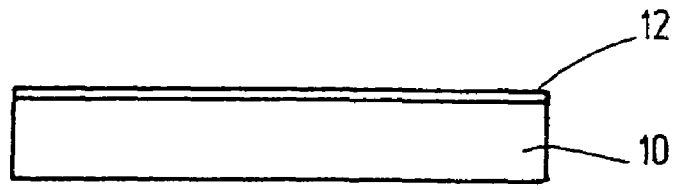
FIGS. 1a through 1e show manufacturing steps in the production of polycrystalline silicon regions in a first exemplary embodiment.
Figure 1B:
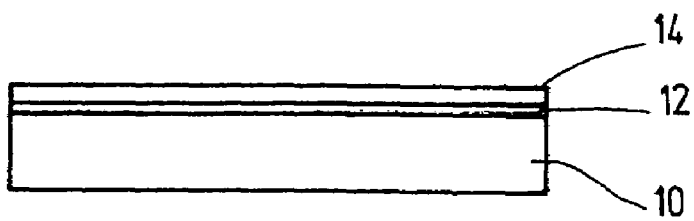
Figure 1C:
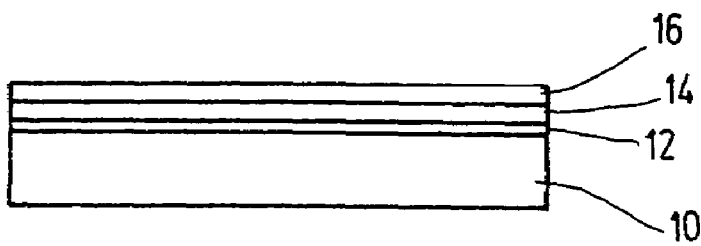

FIGS. 1a through 1e show schematically individual process steps in the production of well-defined polycrystalline silicon regions by an exemplary method according to the present invention. A silicon oxide ($SiO_2$) layer 12 is first applied to a substrate 10, e.g., a stainless steel substrate. Then as illustrated in FIG. 1b, a layer 14 of doped amorphous silicon is deposited on this layer 12. Then as illustrated in FIG. 1c, a passivation layer 16, e.g., of silicon dioxide ($SiO_2$) or silicon nitride ($Si_3N_4$) is applied.

Figure 1D:
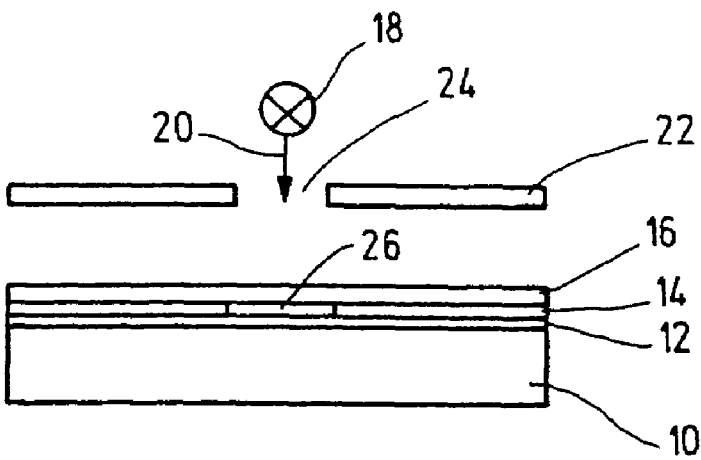

In a next step illustrated in FIG. 1d, the composite of layers 10, 12, 14, 16 is irradiated with a laser source 18, e.g., an excimer laser, using electromagnetic radiation 20. A shadow mask 22 having at least one mask opening 24 is arranged between laser source 18 and the composite of layers 10, 12, 14, 16. In the area of mask opening 24, electromagnetic radiation 20 strikes the composite of layers 10, 12, 14, 16. Passivation layer 16 is transparent to electromagnetic radiation 20. Crystallization occurs in the area of amorphous silicon layer 14—well-defined geometrically by the mask opening—due to irradiation with electromagnetic radiation 20, so that a polycrystalline silicon region 26 develops there. According to the contour of mask opening 24, region 26 of the polycrystalline silicon is defined and is embedded in layer 14 of amorphous silicon. Due to the doping of amorphous silicon 14, an electrically highly conductive polycrystalline silicon region 26 is formed. Since amorphous silicon 14 has a relatively high resistance and polycrystalline region 26 has a high electric conductivity, the electrically conductive regions are well-defined by region 26.

Figure 1E:
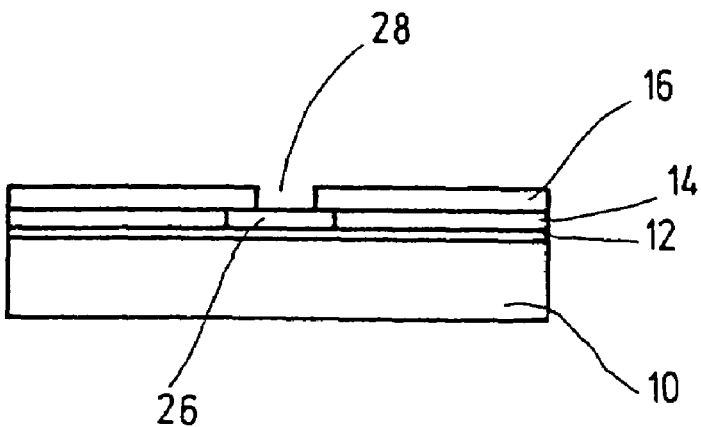

Then as illustrated in FIG. 1e, contact windows 28 are opened in passivation layer 16, and a metallic coating (not shown here) is subsequently deposited in these windows. This metallic coating provides contacting of electrically conducting region 26.

Contact windows 28 may likewise be opened by irradiation with a laser light. In this manner, contact windows 28 may be selectively opened by changing the wavelength of the laser light, for example, and/or increasing the power of laser source 18 and providing a suitable shadow mask.

Photolithographic process steps may not be required for production of well-defined electrically conductive regions 26 of polycrystalline silicon. Furthermore, irradiation with laser light may not be critical thermally, so that substrate 10 is not exposed to an excessive thermal load. In this manner, electrically conducting regions 26 may be produced with a high process reliability and a high process rate.

The exemplary method according to the present invention may be used, for example, in the production of high-pressure sensors in which substrate 10 is made of a stainless steel and electrically conducting regions 26 form wire strain gauges in a bridge circuit (e.g., a Wheatstone bridge). This may require only an appropriately adapted configuration of shadow mask 22, which has an appropriate number of mask openings 4 (e.g., four in this case) for definition of the bridge resistors and corresponding openings to form the feeder lines (printed conductors). In the case of high-pressure sensors having stainless steel substrates or other structural components having non-silicon wafer substrates, the exemplary method according to the present invention may be desirable because it may eliminate the use of conventional photolithography which with these components may be a yield-limiting process that may be difficult to control.

FIGS. 2a through 2f illustrate another exemplary method according to the present invention. The same parts as in FIG. 1 are provided here with the same reference numbers and will not be explained again here, so that only the differences will be discussed.

In contrast with the exemplary embodiment illustrated in FIGS. 1a through 1e, polycrystalline silicon region 26 is structured before deposition of passivation layer 16. This may make it possible, as illustrated in FIG. 2d, to selectively remove the regions of amorphous silicon (former layer 14) surrounding polycrystalline silicon regions 26 produced then. Because of the prevailing etching selectivity between amorphous silicon and polycrystalline silicon, which may be particularly pronounced in the case of strong boron doping, this may be implemented by an etching attack, e.g., through the use of plasmas containing hydrogen or halogen, in a simple manner without a photolithography step. Following this, as illustrated in FIG. 2e, passivation layer 16 is deposited and then (FIG. 2f) contact windows 28 are structured therein. These windows are then metal plated again so that polycrystalline silicon regions 26 may be connected to an electric circuit.

Figure 2A:
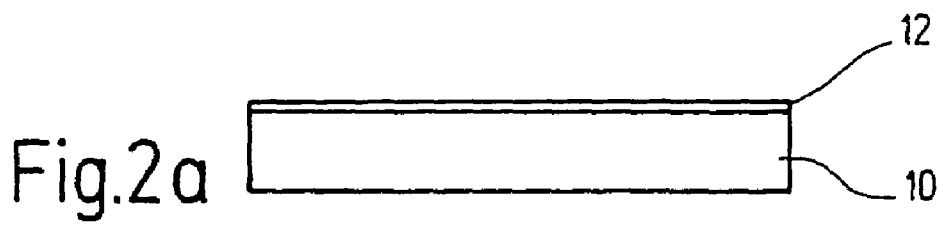
FIGS. 2a through 2f show process steps for production of polycrystalline silicon regions in a second exemplary embodiment.
Figure 2B:
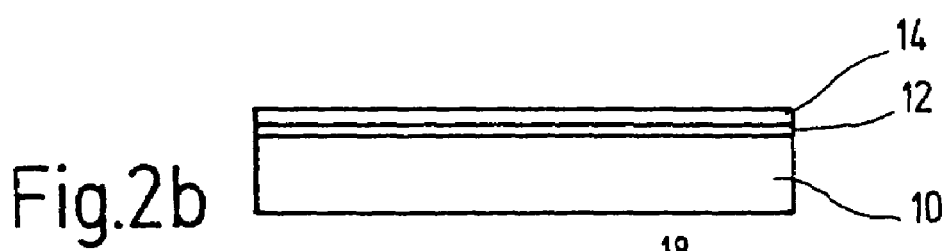
Figure 2C:
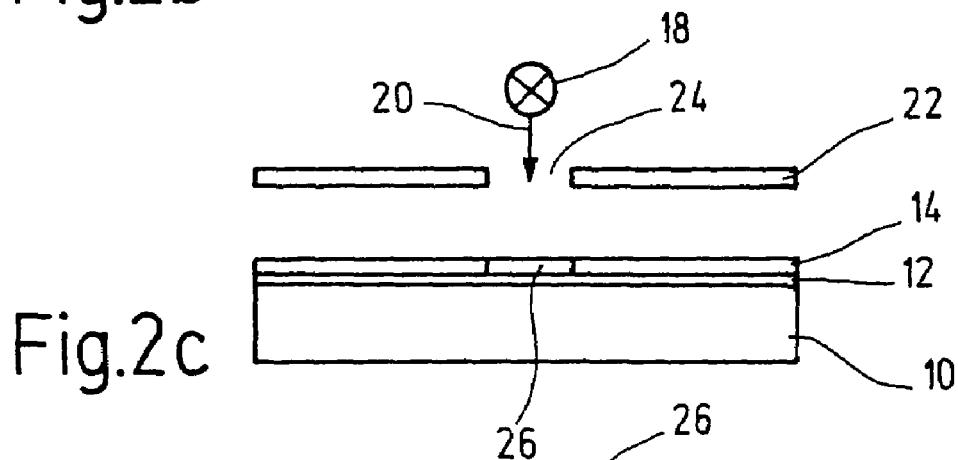
Figure 2D:
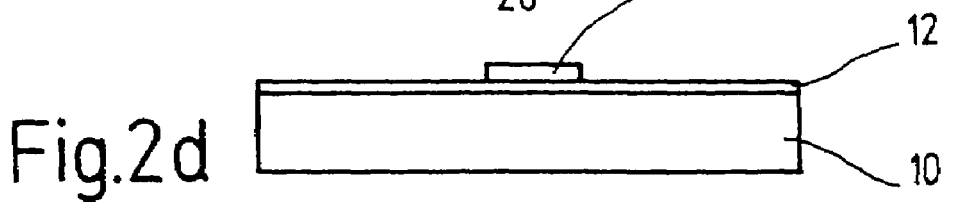
Figure 2E:
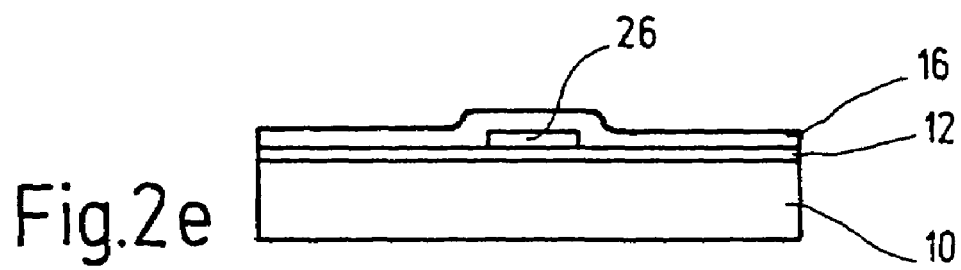
Figure 2F:
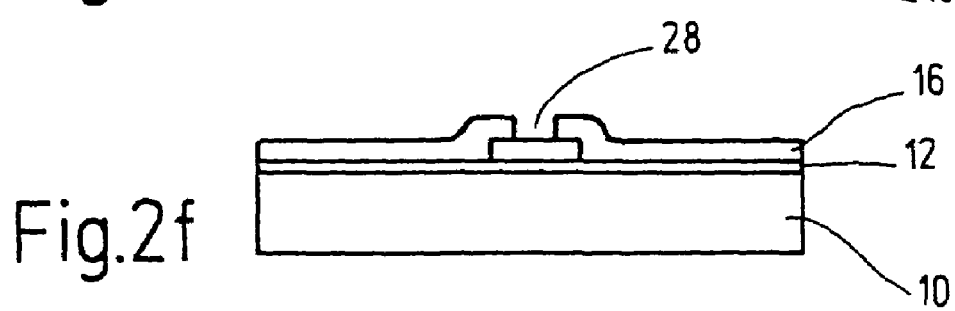

In the first exemplary embodiment, the process steps illustrated in FIGS. 1a, 1b and 1c, and in the second exemplary embodiment, the steps illustrated in FIGS. 2a and 2b may be performed immediately in succession in one recipient without any negative effect on the vacuum atmosphere required in the meantime, or at least having to release the vacuum. This may yield on the whole a shorter process running time. Also, a thermal stress on substrate 10 may be greatly reduced in comparison with the conventional LPCVD deposition method for polycrystalline silicon. In addition, due to the prior doping of amorphous silicon in layer 14 and the subsequent well-defined exposure of regions 26 to electromagnetic radiation 20, very homogeneous polycrystalline silicon regions 26 may be obtained, resulting in a considerable reduction in asymmetry in the entire bridge when used as wire strain gauges in a Wheatstone resistance bridge, so that high-precision piezoresistive pressure sensors may be produced through this exemplary method according to the present invention.

What is claimed is:

1. A method of producing a polycrystalline silicon electrically-conducting region, comprising:
providing a substrate with an insulating layer and a layer of doped amorphous silicon;
positioning a shadow mask having an opening, between a laser source and the substrate having the insulating layer and the doped amorphous silicon layer, wherein a contour of the shadow mask opening defines a contour of the electrically conducting region;
performing electromagnetic irradiation on the doped amorphous silicon using the laser source to produce the polycrystalline silicon electrically conducting region;
depositing a metallic layer at least partially above the electrically conducting region; and
before the depositing step:
removing remaining portions of amorphous silicon selectively, in a plasma containing one of hydrogen and halogen without using a photolithographic step; and
applying a passivation layer covering at least the electrically conducting region.

2. The method according to claim 1, wherein the electromagnetic irradiation is performed with an excimer laser.

3. The method according to claim 1, further comprising:
providing the layer of doped amorphous silicon with a passivation layer before the electromagnetic irradiation is performed.

4. The method according to claim 3, wherein the passivation layer includes one of a silicon dioxide and a silicon nitride.

5. The method according to claim 1, further comprising:
creating a contact window in the passivation layer for electric contacting of the electrically conducting region.

6. The method according to claim 5, wherein the contact window is created by electromagnetic radiation using a laser source.

7. The method according to claim 6, wherein the electrically conducting regions and the contact window are produced by using the same laser source but different operating parameters for the laser source.

8. The method according to claim 7, wherein the different operating parameters include at least one of different wavelengths, different irradiation times, and different irradiation intensities.

9. A high pressure sensor comprising:
a wire strain gauge made of at least polycrystalline silicon having at least one electrically conducting region, the polycrystalline silicon including:
a substrate with an insulating layer and a layer of doped amorphous silicon;
a shadow mask having an opening positioned between a laser source and the substrate having the insulating layer and the doped amorphous silicon layer, a contour of the shadow mask opening defining a contour of the electrically conducting region;
a metallic layer deposited at least partially above the electrically conducting region; and
a passivation layer covering at least the electrically conducting region;
wherein, before a deposition of the metallic layer, remaining portions of amorphous silicon are removed selectively, in a plasma containing one of hydrogen and halogen, before the passivation layer is applied, without using a photolithographic step.

* * * * *